(12) United States Patent
Xu et al.

(10) Patent No.: US 6,451,179 B1
(45) Date of Patent: Sep. 17, 2002

(54) METHOD AND APPARATUS FOR ENHANCING SIDEWALL COVERAGE DURING SPUTTERING IN A CHAMBER HAVING AN INDUCTIVELY COUPLED PLASMA

(75) Inventors: Zheng Xu, Foster City; Gongda Yao, Fremont, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/789,960

(22) Filed: Jan. 30, 1997

(51) Int. Cl.$^7$ ............................................... C23C 14/34
(52) U.S. Cl. .................... 204/192.15; 204/298.13; 204/298.25; 204/192.17; 204/192.25
(58) Field of Search .................. 438/688; 204/192.17, 204/192.25, 298.25, 192.12, 192.15, 298.13

(56) References Cited

U.S. PATENT DOCUMENTS

| | | | |
|---|---|---|---|
| 3,594,295 A | 7/1971 | Meckel et al. | 204/192.12 |
| 4,125,446 A * | 11/1978 | Hartsough et al. | 204/192.12 |
| 4,336,118 A | 6/1982 | Patten et al. | 204/192.3 |
| 4,362,632 A | 12/1982 | Jacob | 422/186.04 |
| 4,495,221 A | 1/1985 | Broadbent | 438/679 |
| 4,626,312 A | 12/1986 | Tracy | 204/298.34 |
| 4,661,228 A | 4/1987 | Mintz | 204/298.18 |
| 4,692,230 A | 9/1987 | Nihei et al. | 204/192.31 |
| 4,717,462 A | 1/1988 | Homma et al. | 204/298.06 |
| 4,756,815 A | 7/1988 | Turner | 204/298.25 |
| 4,792,732 A | 12/1988 | O'Loughlin | 315/334 |
| 4,810,342 A | 3/1989 | Inoue | 204/192.17 |
| 4,816,126 A | 3/1989 | Kamoshida et al. | 204/192.3 |
| 4,818,723 A | 4/1989 | Yen | 638/647 |
| 4,824,544 A | 4/1989 | Mikalesen et al. | 204/298.06 |
| 4,842,703 A | 6/1989 | Class et al. | 204/298.18 |
| 4,865,712 A | 9/1989 | Mintz | 204/192.12 |
| 4,871,421 A | 10/1989 | Ogle et al. | 156/345 |
| 4,897,709 A | 1/1990 | Yokoyama et al. | 257/301 |
| 4,925,542 A | 5/1990 | Kidd | 204/192.31 |
| 4,941,915 A | 7/1990 | Matsuoka et al. | 204/192.11 |
| 4,944,961 A | 7/1990 | Lu et al. | 427/531 |
| 4,970,176 A | 11/1990 | Tracy et al. | 438/660 |
| 4,999,096 A | 3/1991 | Nihei et al. | 204/192.15 |
| 5,032,468 A * | 7/1991 | Dumont et al. | 428/636 |
| 5,065,698 A | 11/1991 | Koike | 118/719 |
| 5,091,049 A | 2/1992 | Campbell et al. | 216/37 |
| 5,171,412 A | 12/1992 | Talieh et al. | 204/192.15 |
| 5,175,608 A | 12/1992 | Nihei et al. | 257/751 |
| 5,178,739 A | 1/1993 | Barnes et al. | 204/298 |
| 5,180,687 A * | 1/1993 | Mikoshiba et al. | 437/187 |
| 5,186,718 A | 2/1993 | Tepman et al. | 29/25.01 |
| 5,223,112 A | 6/1993 | Tepman | 204/298.11 |
| 5,234,560 A | 8/1993 | Kadlec et al. | 204/192.12 |
| 5,241,245 A | 8/1993 | Barnes et al. | 315/111.41 |
| 5,288,379 A * | 2/1994 | Namiki et al. | 204/298.25 |
| 5,292,393 A | 3/1994 | Maydan et al. | 156/345 |
| 5,320,728 A | 6/1994 | Tepman | 204/192.12 |

(List continued on next page.)

FOREIGN PATENT DOCUMENTS

| | | | |
|---|---|---|---|
| EP | 0607797 | 1/1994 | |
| EP | 0807954 | 5/1997 | H01J/37/34 |
| EP | 0836219 | 10/1997 | H01J/37/34 |

(List continued on next page.)

OTHER PUBLICATIONS

Notice to File Response for Korean Patent Application No. 10–1998–0002277 dated Sep. 18, 2000 (English).
Notice of Final Rejectin for Korean Patent Application No. 10–1998–0002277 dated Oct. 30, 2001 (English).
English Translation of JP 3–240944 (previously cited by Examiner and copy previously provided to Examiner).

(List continued on next page.)

*Primary Examiner*—Steven H. VerSteeg
(74) *Attorney, Agent, or Firm*—Konrad, Raynes, Victor & Mann

(57) ABSTRACT

Increased sidewall coverage in a wetting layer for a substrate via or trench is achieved in an inductively coupled plasma chamber by sputtering relatively pure aluminum.

32 Claims, 5 Drawing Sheets

U.S. PATENT DOCUMENTS

| | | | |
|---|---|---|---|
| 5,330,628 A | 7/1994 | Demaray et al. | 204/192.12 |
| 5,404,079 A | 4/1995 | Ohkuni et al. | 315/111.81 |
| 5,427,668 A | 6/1995 | Sato et al. | 204/298.05 |
| 5,430,355 A | 7/1995 | Paranjpe | 315/111.21 |
| 5,431,799 A | 7/1995 | Mosely et al. | 204/298.06 |
| 5,443,995 A | 8/1995 | Nulman | 438/654 |
| 5,503,676 A | 4/1996 | Shufflebotham et al. | 118/723 MR |
| 5,545,927 A * | 8/1996 | Farooq et al. | 257/762 |
| 5,573,595 A | 11/1996 | Dible | 118/723 E |
| 5,591,313 A | 1/1997 | Barber, Jr. et al. | 204/192.12 |
| 5,639,357 A | 6/1997 | Xu | 204/192.3 |
| 5,851,920 A * | 12/1998 | Taylor et al. | 438/648 |
| 6,042,700 A * | 3/2000 | Gopalraja et al. | 204/192.15 |
| 6,114,244 A * | 9/2000 | Hirose et al. | 438/688 |

FOREIGN PATENT DOCUMENTS

| | | | |
|---|---|---|---|
| GB | 2162365 | 1/1986 | |
| GB | 2231197 | 11/1990 | |
| JP | 5819363 | 4/1983 | |
| JP | 59190363 | 10/1984 | |
| JP | 61190070 | 8/1986 | |
| JP | 2-175864 | 7/1990 | C23C/14/34 |
| JP | 2-216822 | 8/1990 | H01L/21/285 |
| JP | 3-22534 | 1/1991 | H01L/21/3205 |
| JP | 5152248 | 1/1991 | |
| JP | 3-240944 | 10/1991 | C23C/14/14 |
| JP | 5-129276 | 5/1993 | H01L/21/31 |
| JP | 5-283366 | 10/1993 | H01L/21/285 |
| JP | 6232055 | 8/1994 | |
| TW | 343384 | 6/1986 | H01L/23/32 |
| TW | 356589 | 1/1996 | H01L/23/428 |
| WO | 8606923 | 11/1986 | |

OTHER PUBLICATIONS

Office Action issued Jan. 18, 2000 in R.O.C. patent application 87100150.

Kidd, P. "A magnetically confined and electron cyclotron resonance heated plasma machine for coating and ion surface modification use," J. Vac. Sci. Technol. A 9 (3), May/Jun. 1991, pp. 466–473.

Kondoh, E., et al. "Chemical vapor deposition of aluminum from dimethylaluminumhydride (DMAH): Characteristics of DMAH vaporization and Al growth kinetics," J. Vac. Sci. Technol. A 13(6), Nov./Dec. 1995, pp. 2863–2871.

U.S. 09/493,700 filed Jan. 28, 2000 (Atty. Dkt. 1657.X1/7037).

Singapore Search Report dated Jul. 9, 1999 in Application No. 9800092-0 filed Jan. 13, 1998.

Search report dated Feb. 27, 1997, EPC application No. 96308251.6.

Search Report dated Jun. 3, 1998, EPC application No. 98101169.5.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

S.H. Han et al., "Surface Topographical Effect of a Cast Magnetron Sputtering Target on the Composition of TbFeCo Magneto–Optic Thin Films," Proceedings of Magneto–Optical Recording International Symposium '91, *J. Magn. Soc. Jpn.*, vol. 15, Supplement No. S1 (1991), pp. 385–388.

Brian Chapman, "Glow Discharge Processes," A Wiley–Interscience Publication, pp. 139–287.

J.L. Vossen, "Control of Film Properties by RF–Sputtering Techniques," *Journal of Vac. Sci. and Tech.*, vol. 8, No. 5, p. 512, 1971.

U.S. Ser. No. 08/929,739 (Atty. Dkt. No. 2168/MD/PVD/DV).

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

U.S. patent application Ser. No. 08/789,960, filed Jan. 30, 1997 (Aty. Dk. 1643/PVD/DV).

Meikle et al., "Semiconductor Process Considerations for Collimated Source Sputtering of Ti Films," Jun. 9–10, 1992 VMIC Conference, 1992, pp. 289–291.

Van Gogh et al., "Characterization of Improved TiN Films by Controlled Divergence Sputtering," Jun. 9–10, 1992 VMIC Conference, 1992, pp. 310–313.

Demaray et al., "Aluminum Alloy Planarization for Topography Control of Multilevel VLSI Interconnect," Proceedings—VLSI and Computers: First International Conference on Computer Technology, Systems and Applications, May 11, 1987.

Park et al., "Influences of D.C. Bias on Aluminum Films Prepared with a High Rate Magnetron Sputtering Cathode," *Thin Solid Films*, 1985.

Hoffman, "Practical Troubleshooting of Vacuum and Deposition Processes and Equipment for Aluminum Metallization," *Solid State Technology*, vol. 21, No. 12, pp. 47–56, Dec. 12, 1978.

Y–W. Kim et al., "Ionized Sputter Deposition of AlCu: Film Microstructure and Chemistry, " *J. Vac. Sci. Technol.*, vol. A12, pp. 3169–3175, 1994.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

Hoffman, "Tungsten Titanium Diffusion Barrier Metallization," *Solid State Technology*, vol. 26, No. 6, pp. 119–126, Jun. 6, 1983.

Hoffman et al., "Planarization of Aluminum Alloy Films During High Rate Sputtering," *Thin Solid Films*, vol. 153, pp. 369–377, Oct. 26, 1987.

Ahn et al., Effects of Substrate Temperature on Copper Distribution, Resistivity, and Microstructure in Magnetron–Sputtered Al–Cu Films, *Thin Solid Films*, vol. 153, pp. 409–419, Oct. 26, 1987.

Helmer et al., "Pressure Effects in Planar Magnetron Sputter Deposition," *Journal of Vacuum Science & Technology A (Vacuum, Surfaces, and Films)*, vol. 4, No. 3, pt. 1, pp. 408–412, May–Jun., 1986.

Skelly et al., "Significant Improvement in Step Coverage Using Bias Sputter Aluminum," *J. Vac. Sci. Technol.*, 1986.

Joshi et al., Collimated Sputtering of TiN/Ti Liners into Sub–Half Micron High Aspect Ratio Contacts/Lines, Jun. 9–10, 1992 VMIC Conference 1992, pp. 253–259.

M. Yamashita, "Sputter Type High Frequency Ion Source for Ion Beam Deposition Apparatus," *Jap. J. Appl. Phys.*, vol. 26, pp. 721–727, 1987.

Singapore Search Report in Application No. 9704107-3 filed Nov. 20, 1997.

* cited by examiner

METHOD AND APPARATUS FOR ENHANCING SIDEWALL COVERAGE DURING SPUTTERING IN A CHAMBER HAVING AN INDUCTIVELY COUPLED PLASMA

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low pressure plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target to the substrate being deposited, at angles which are oblique to the surface of the substrate. As a consequence, materials deposited in etched openings including trenches and holes of semiconductor devices having openings with a high depth to width aspect ratio, may not adequately coat the walls of the openings, particularly the bottom walls. If a large amount of material is being deposited, the deposited material can bridge over causing undesirable cavities in the deposition layer. To prevent such cavities, sputtered material can be redirected into substantially vertical paths between the target and the substrate by negatively biasing (or self biasing) the substrate and positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density, in the range of $10^{11}$–$10^{13}$ions/cm$^3$.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

Although ionizing the deposition material facilitates deposition of material into high aspect ratio channels and vias, many sputtered contact metals have a tendency to "dewet" from the sidewalls of the opening. Because the metal is typically deposited at relatively high temperatures as a result of the sputtering process, the deposited metal ions and atoms can have a relatively high degree of mobility which enables the deposited metal to form beads on the interior surfaces of the opening rather than a smooth continuous layer as desired. This tendency to form beads is often referred to as "dewetting" and can cause voids to form in the deposited metal.

To prevent or reduce dewetting, it has been proposed to deposit the contact metal in two separate layers. First a relatively thin "wetting layer" is deposited to coat the interior surfaces of the opening. This wetting layer is often deposited at relatively low temperatures by controlling the substrate temperature to reduce the metal ion and atom mobility. Consequently, the crystalline bonds of the deposited metal can hold the metal atoms and ions in place as the wetting layer is deposited to reduce the occurrence of dewetting. Typical wetting layer metals for the deposition of aluminum alloy contacts include AlCu and AlSiCu alloys.

Once the wetting underlayer has been deposited and cooled to lock the wetting layer in place, the remaining metal contact layer is deposited and planarized, typically in a separate sputtering deposition or chamber. The presence of the initial wetting layer prior to the deposition of the remaining contact metal or metals has been found to significantly reduce dewetting of the metal being deposited onto the dewetting underlayer. As a consequence, the formation of voids can be reduced.

However, when the wetting underlayer is deposited into high aspect ratio openings in an inductively coupled plasma sputtering chamber, it has been found that the wetting layer itself has a tendency to dewet, such that the wetting layer may not form a continuous layer over the interior surfaces of the opening. This tendency to dewet is particularly frequent on the sidewall surfaces of the opening which typically receive a relatively thin coating of material as compared to the bottom surfaces of the opening in inductively coupled plasma sputtering processes. On those surfaces of the opening in which the wetting layer does dewet, the metal later deposited on those dewetted surfaces also tends to dewet, thereby increasing the chances of the formation of an undesirable void in the metal contact layer.

SUMMARY OF THE PREFERRED EMBODIMENTS

It is an object of the present invention to provide an improved method and apparatus for sputter depositing a layer which enhances both sidewall and bottom coverage.

These and other objects and advantages are achieved by a plasma generating apparatus in which, in accordance with one aspect of the invention, a layer of relatively pure aluminum is sputtered in an inductively coupled plasma chamber to form a wetting layer prior to deposition of the remaining metal contact layer. It has been found that sputtering relatively pure aluminum (preferably 99.999% pure) to form a wetting underlayer can significantly reduce the incidence of dewetting of the wetting layer. As a consequence, coverage of sidewalls of channels, vias and other high aspect ratio openings and structures having a sidewall in a substrate may be improved so as to substantially reduce the formation of voids in the overlayer.

In an alternative embodiment, the wetting underlayer may be sputtered in a hydrogen-argon mixture. The hydrogen combines with the sputtered aluminum to form a wetting layer which includes molecules of aluminum hydride. It is believed that these aluminum hydride molecules have a relatively low sticking coefficient on the wetting layer surface. As a result, it is also believed that the aluminum hydride molecules will facilitate formation of a continuous, conformal wetting underlayer with good sidewall coverage.

DETAILED DESCRIPTION OF THE DRAWINGS

Figure 1:
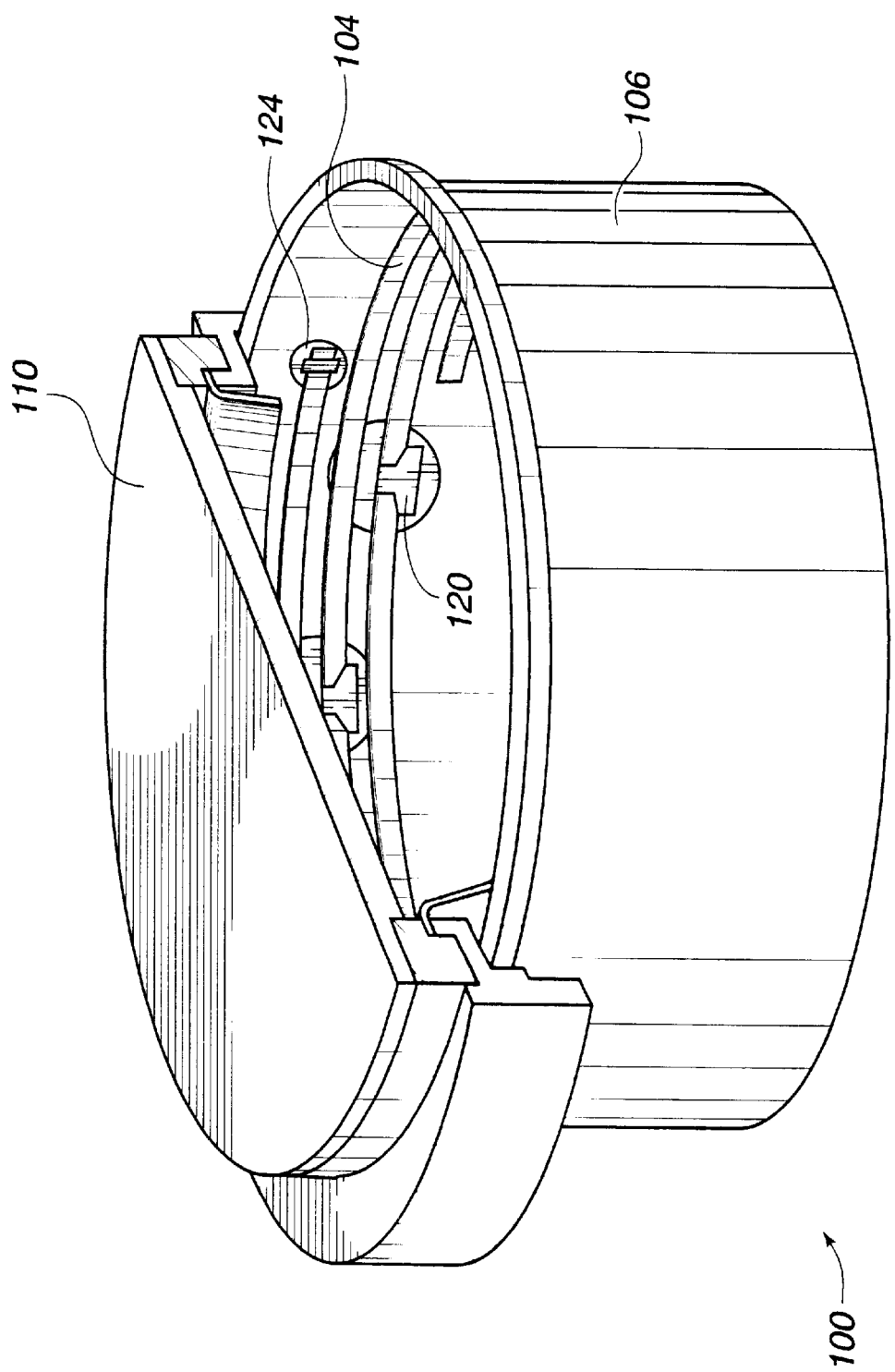
FIG. 1 is a perspective, partial cross-sectional view of a plasma generating chamber for improving sidewall coverage in a manner in accordance with an embodiment of the present invention.
Figure 2:
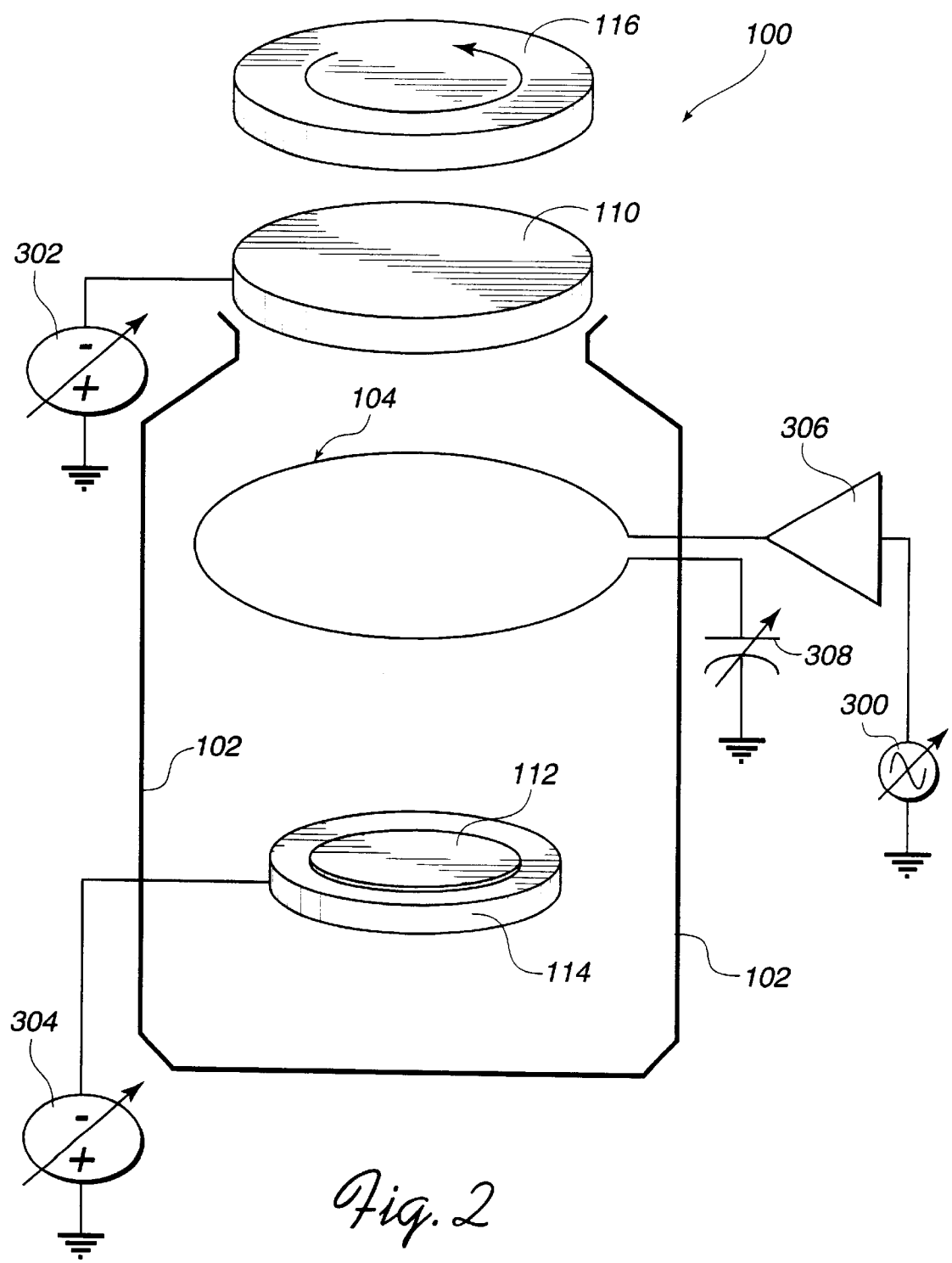
FIG. 2 is a schematic diagram of the electrical interconnections to the plasma generating chamber of FIG. 1.

Referring first to FIGS. 1–2, an example of a plasma generator used in accordance with an embodiment of the present invention comprises a substantially cylindrical plasma chamber 100 which is received in a vacuum chamber 102 (represented schematically in FIG. 2). The plasma chamber 100 of this embodiment has a helical coil 104 which is carried internally of the vacuum chamber walls by a chamber shield 106. The chamber shield 106 protects the interior walls of the vacuum chamber 102 from the material being deposited within the interior of the plasma chamber 100.

An ion flux strikes a negatively biased target 110 positioned above the plasma chamber 100. The plasma ions eject material from the target 110 onto a substrate 112 which may be a wafer or other workpiece supported by a pedestal 114 at the bottom of the plasma chamber 100. An optional rotating magnet assembly 116 may be provided above the target 110 to produce magnetic fields which sweep over the face of the target 110 to promote uniform erosion by sputtering of the target 110.

Radio frequency (RF) energy from an RF generator 300 (FIG. 2) is radiated from the coil 104 into the interior of the plasma chamber 100, which energizes a plasma within the plasma chamber 100. The deposition material sputtered from the target 110 passes through the plasma energized by the coil 104 prior to being deposited on the substrate 112. A portion of the deposition material passing though the plasma is ionized by the plasma. The ionized deposition material is then attracted to a negative potential on the substrate 112. In this manner, the ionized deposition material is redirected to a more vertical path which facilitates depositing more material into high aspect ratio openings in the substrate.

As will be explained in greater detail below, in accordance with one aspect of the present invention, a wetting layer is formed by sputtering a target 110 of relatively pure aluminum. Such a wetting layer has been found to be resistant to dewetting so as to improve the sidewall coverage of openings or other structures having sidewalls as the remaining interconnect layer is deposited. For example, the improved sidewall coverage of the wetting underlayer has been found to significantly facilitate the flow of additional aluminum into the channel, even when the added aluminum is not ionized, so as to significantly reduce the incidence of undesirable voids forming in the aluminum overlayer.

A deposition process in accordance with the present invention is useful for a variety of underlayers including wetting layers, seed layers, and nucleation layers. In addition, any structure having a sidewall can benefit this process including capacitor electrodes.

FIG. 2 includes a schematic representation of the electrical connections of the plasma generating apparatus of this illustrated embodiment. To sputter target material onto the substrate 112, the target 110 is preferably negatively biased by a variable DC power source 302 to attract the ions generated by the plasma. In the same manner, the pedestal 114 may be negatively biased by a variable RF power source 304 to bias the substrate 112 negatively to attract the ionized deposition material to the substrate 112. In an alternative embodiment, the pedestal 114 may be biased by a high frequency RF power source to bias the substrate 112 so as to attract the ionized deposition material more uniformly to the substrate 112. In yet another alternative embodiment, as set forth in copending application Ser. No. 08/677,588, entitled "A Method for Providing Full-face High Density Plasma Physical Vapor Deposition," filed Jul. 9, 1996 and assigned to the assignee of the present application, an external biasing of the substrate 112 may be omitted.

One end of the coil 104 is coupled to an RF source such as the output of an amplifier and matching network 306, the input of which is coupled to the RF generator 300. The other end of the coil 104 is coupled to ground, preferably through a capacitor 308, which may be a variable capacitor.

The coil 104 is carried on the chamber shield 106 by a plurality of coil standoffs 120 (FIG. 1) which electrically insulate the coil 104 from the supporting chamber shield 106. In addition, the insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield. 106. Such a completed conducting path is undesirable because it could short the coil 104 to the chamber shield 106 (which is typically grounded).

RF power is applied to the coil 104 by feedthrough bolts which are supported by insulating feedthrough standoffs 124. The feedthrough standoffs 124, like the coil support standoffs 120, permit repeated deposition of conductive material from the target onto the feedthrough standoff 124 without the formation of a conducting path which could short the coil 104 to the chamber shield 106. The coil feedthrough standoff 124, like the coil support standoff 120, has an internal labyrinth structure to prevent the formation of a short between the coil 104 and the wall 126 of the shield. The feedthrough is coupled to the RF generator 300 (shown schematically in FIG. 2) through the matching network 306 (also shown schematically in FIG. 2).

As set forth above, the RF power radiated by the coil 104 energizes the plasma in the chamber to ionize the target material being sputtered from the target 110. The ionized sputtered target material is in turn attracted to the substrate 112 which is at a negative (DC or RF) potential to attract the ionized deposition material to the substrate 112.

Figure 3:
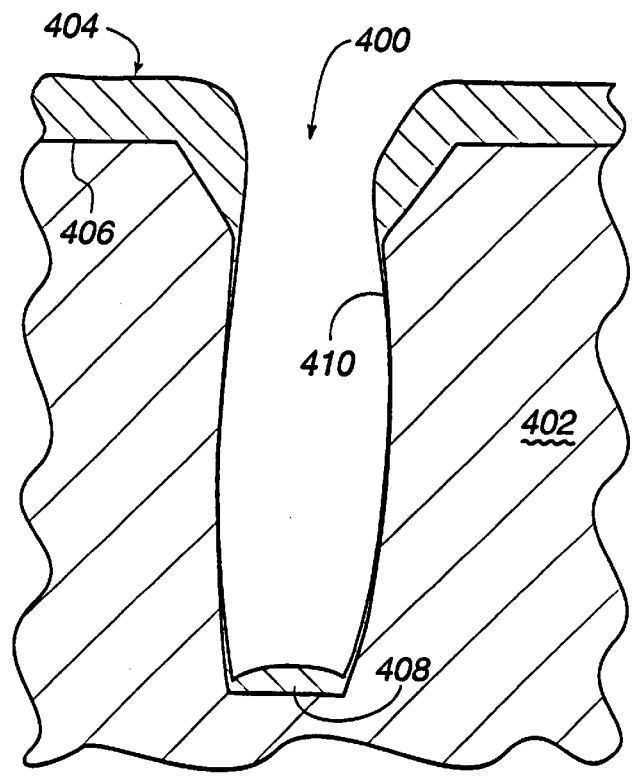
FIG. 3 is a cross-sectional view of an opening having an underlayer of a prior art deposition material deposited in a high density plasma.
Figure 4:
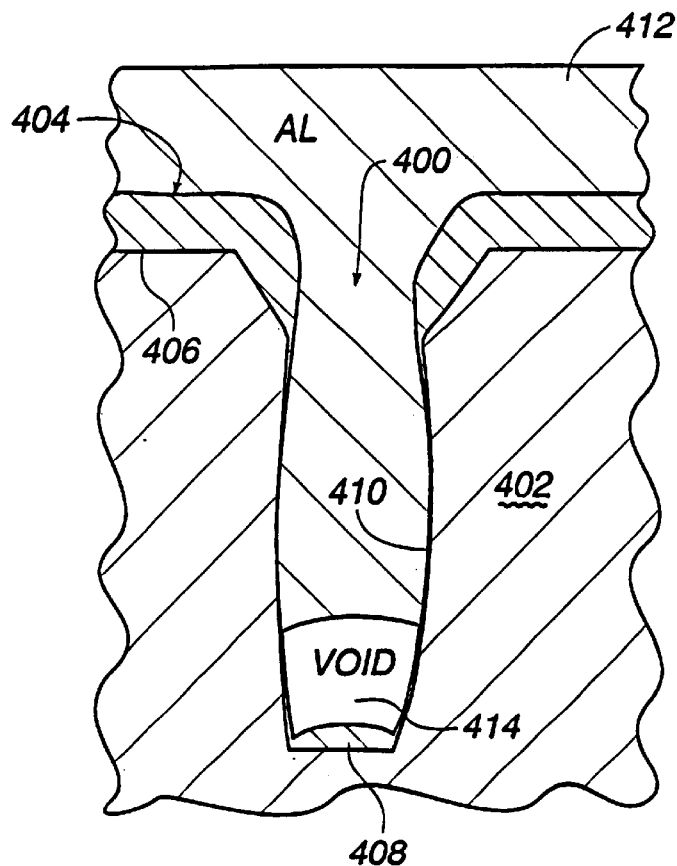
FIG. 4 is a cross-sectional view of the opening of FIG. 3 having an interconnect layer deposited over the underlayer of FIG. 3.

FIG. 3 shows in cross section an opening 400 in an oxide layer 402 of a substrate in which a wetting underlayer 404 of an aluminum alloy such as AlCu (0.5% copper) has been deposited. The opening 400 may be a via, trench or other structure having a sidewall or a narrow cross-sectional width (1 micron or less, for example) and a high depth to width aspect ratio. In the example of FIG. 4, the opening has a width of approximately 0.34 microns and a depth to width aspect ratio of approximately 3. Absent ionization, much of the aluminum alloy atoms arriving on the surface 406 of the substrate would be at angles too oblique to penetrate very deeply into the opening 400. Consequently, to increase the amount of material entering the opening 400, aluminum alloy sputtered from the target 110 is preferably ionized by the plasma in the chamber so that the path of travel of at least some of the deposition material is more vertically aligned so as to reach the bottom of the opening 400.

In the deposition of the aluminum underlayer 404 of FIG. 4, the pressure of the argon sputtering gas may be approximately 30 mTorr, a typical value for high density plasma sputtering. Although the ionization of the aluminum permits very good bottom coverage as indicated by the bottom portion 408 of the underlayer 404, it has been found that the resultant sidewall coverage can be very thin or even absent as indicated at the side wall portion 410 of the opening 400 of the substrate 402, so as to become discontinuous. It is believed that discontinuous sidewall coverage or very thin coverage occurs as a result of the aluminum alloy underlayer dewetting from the oxide surface. Such discontinuities or thin coverage can hinder the interaction between the aluminum alloy wetting layer 404 and the subsequently deposited aluminum interconnect layer 412 (FIG. 4) such that voids 414 can form in the aluminum layer at an undesirable rate.

Figure 5A:
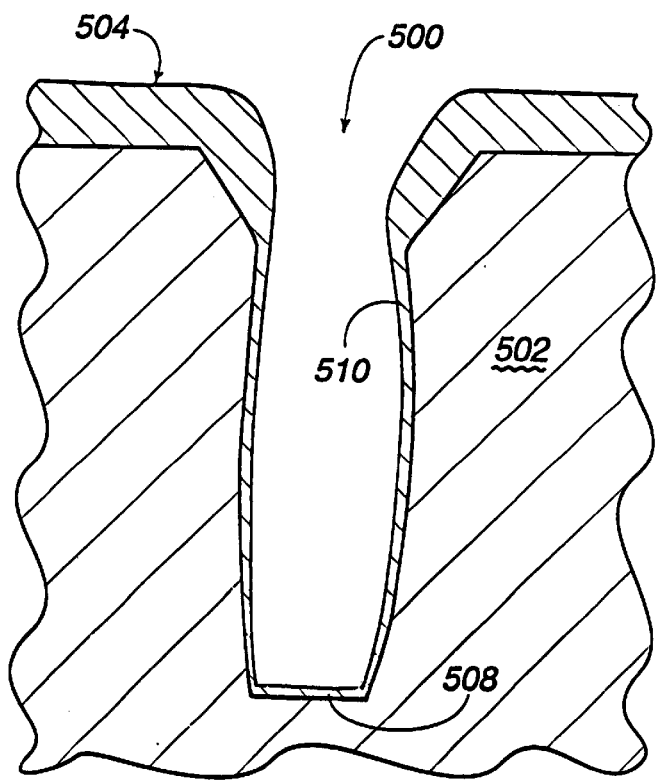
FIG. 5(a) is a cross-sectional view of an opening deposited with an underlayer of deposition material in accordance with the present invention.
Figure 5B:
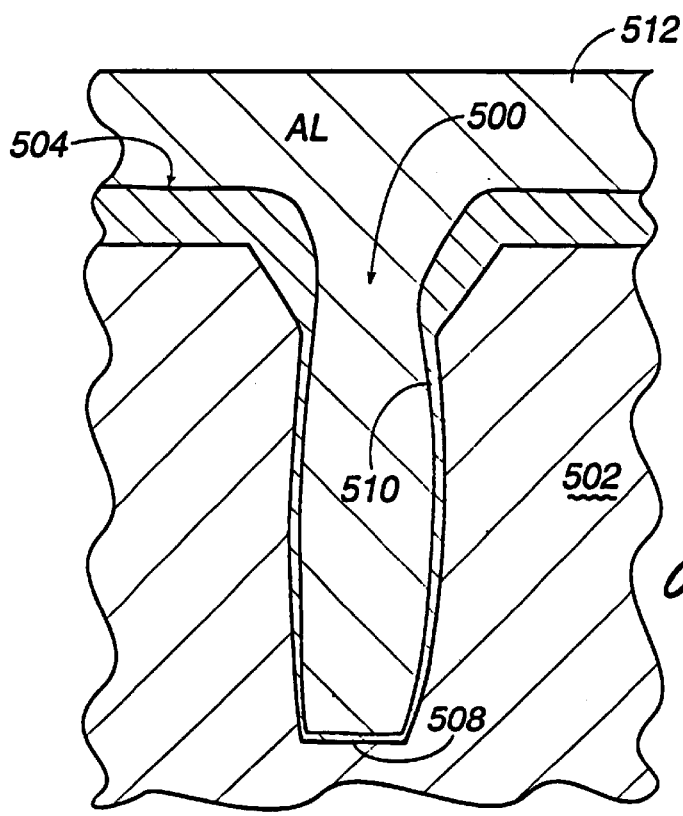
FIG. 5(b) is a cross-sectional view of the opening of FIG. 5(a) having an interconnect layer deposited over the underlayer of FIG. 5(a).

It has been found that the sidewall coverage of the underlayer may be significantly improved by sputtering relatively pure aluminum (preferably at least 99.99% pure and more preferably at least 99.999% pure) to form the wetting layer. FIG. 5(*a*) shows an opening 500 in an oxide layer 502 of a substrate in which a wetting underlayer 504 of relatively pure aluminum has been sputter deposited in an ionizing inductively coupled plasma. As shown in FIG. 5(*a*), very good bottom coverage as indicated by the bottom portion 508 has been maintained yet the sidewall coverage has been substantially thickened as indicated by the side wall portion 510 of the underlayer 504. (The relative proportions of the underlayer 504 are not shown to scale in FIG. 5(*a*) but are exaggerated for purposes of clarity.) This improved sidewall coverage is believed to result from a decrease in dewetting of the deposited aluminum.

FIG. 5(*b*) shows an aluminum interconnect layer 512 deposited onto the relatively pure aluminum underlayer 504 and then planarized. Because of the improved sidewall coverage of the underlayer 504, the aluminum interaction with the relatively pure aluminum wetting layer 504 is improved such that the opening more frequently fills completely without forming a void.

Although the improved process of the illustrated embodiment has been described in connection with a wetting underlayer, it should be appreciated that the present invention is applicable to enhancing sidewall coverage of other layers such as seed layers and nucleation layers. In addition, materials other than aluminum may be deposited onto a wetting or other underlayer formed in accordance with the present invention. Also, the underlayer may be formed on surfaces other than oxide surfaces including barrier layers and other under layers formed of various materials including titanium, titanium nitride, tantalum and tantalum nitride. Other structures which can benefit from the process of the present invention include electrodes of devices such as capacitors and other conductors.

In the embodiment of FIGS. 5(*a*) and (*b*), the relatively pure aluminum target was sputtered in a sputtering gas of argon to form the wetting underlayer. In an alternative embodiment, the wetting underlayer may be sputtered in a hydrogen-argon mixture. As aluminum is sputtered from the relatively pure aluminum target and ionized by the plasma, hydrogen combines with the aluminum such that the wetting layer thereby formed includes molecules of aluminum hydride. It is believed that these aluminum hydride molecules have a relatively low sticking coefficient on the surface of the wetting underlayer as it forms. Consequently, it is also believed that the aluminum hydride molecules will also facilitate formation of a continuous, conformal wetting underlayer with good sidewall coverage. Suitable pressures of hydrogen ($H_2$) can range from 10 to 100 mTorr and suitable pressures of argon can range from 2 to 10 mTorr. Of course, the actual values will depend upon the particular application and values outside these ranges may be appropriate for some applications.

Figure 6:
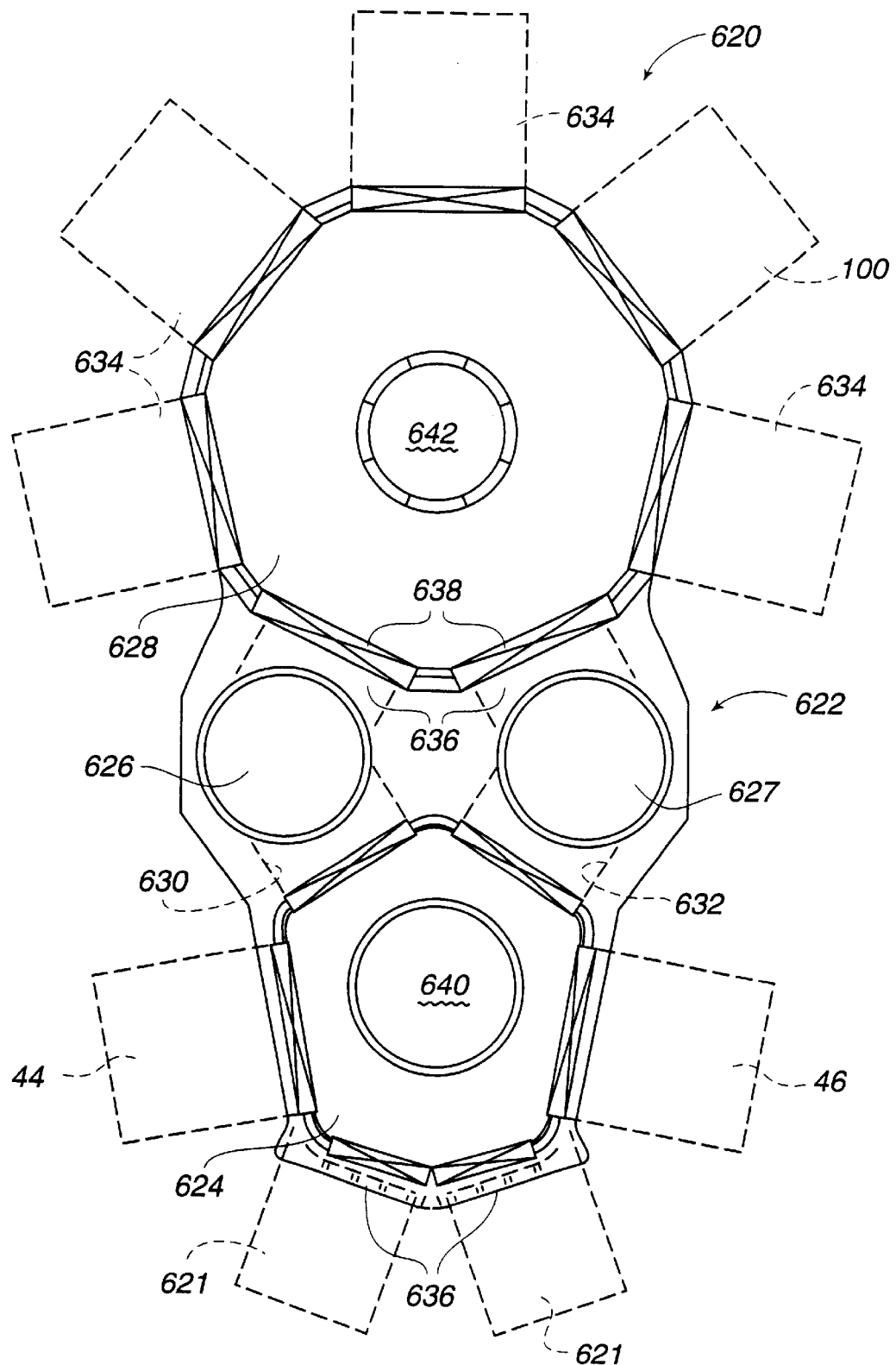
FIG. 6 is a schematic top plan view of a staged-vacuum, multiple chamber semiconductor wafer processing system incorporating the vacuum chamber of FIGS. 1–2.

FIG. 6 is a schematic plan view of a staged-vacuum semiconductor wafer processing system 620 of the type which is described in greater detail in U.S. Pat. No. 5,186,718. The system 620 includes a housing 622 which defines four chambers: a robot buffer chamber 624 at one end, a transfer robot chamber 628 at the opposite end, and a pair of intermediate processing or treatment chambers 626 and 627. Although one or more load lock chambers 621 may be used, preferably two or three such chambers are mounted to the buffer chamber and in communication with the interior of the buffer robot chamber via access ports 636 and associated slit valves 638. A plurality of vacuum processing chambers 634 (including the chamber 100 described above) are mounted about the periphery of the transfer robot station. The chambers 634 may be adapted for various types of processing including etching and/or deposition. Access is provided to and between each of the chambers by an associated port 636 and gate valve 638.

The robot chambers 624 and 628 communicate with one another via the intermediate processing or treatment chambers 626 and 627 (also called "treatment" chambers). Specifically, intermediate treatment chamber 626 is located along a corridor or pathway 630 which connects the transfer robot chamber 628 to the buffer robot chamber 624. Similarly, the second intermediate treatment chamber 627 is located along a separate corridor or pathway 632 which connects the robots 628 and 624. These separate paths between the two robot or transfer chambers permit one path to be used for loading or unloading while the system is being used for wafer processing treatment and, thus, provide increased throughput. The chambers 626 and 627 can be dedicated to pre-treating (e.g., plasma etch cleaning and/or heating) of the wafers before processing in chambers 634 or post-treating (e.g., cool-down) of the wafers following treatment in chambers 634; alternatively, one or both of the chambers 626 and 627 can be adapted for both pre-treatment and post-treatment.

Preferably, the housing 622 is a monolith, i.e., it is machined or otherwise fabricated of one piece of material such as aluminum to form the four chamber cavities 624, 626, 627 and 628 and the interconnecting corridors or pathways 630 and 632. The use of the monolith construction facilitates alignment of the individual chambers for wafer transport and also eliminates difficulties in sealing the individual chambers.

One typical operational cycle of wafer transport through the system 20 is as follows. Initially, an R THETA buffer robot 640 in chamber 624 picks up a wafer from a cassette load lock 621 and transports the wafer to chamber 626 which illustratively etch cleans the surface of the wafer. R THETA transfer robot 642 in chamber 628 picks up the wafer from the pre-cleaning chamber 626 and transfers the wafer to a selected one of the preferably high vacuum processing chambers 634. One of these chambers is the chamber 100 which deposits a wetting layer of relatively pure aluminum as set forth above. Following processing, transfer robot 642 can transfer the wafer selectively to one or more of the other chambers 634 for processing. Included amongst these chambers is a deposition chamber which deposits aluminum or other suitable interconnect material on the underlayer previously deposited in the chamber 100. In this step, sufficient interconnect material is deposited to fill the vias and channels. The resulting interconnect layer is preferably planarized by suitable planarization techniques which typically include heating the substrate.

Because the wetting underlayer has good sidewall as well as bottom coverage, the chamber depositing the aluminum may be a conventional magnetron sputtering chamber which does not have an RF coil to produce a high density plasma to ionize the aluminum. Instead, the aluminum may be deposited without being ionized yet can form an interconnect layer having a relatively low resistance with few or no voids in the openings. Upon completion of depositions and etchings, the transfer robot 642 transfers the wafer to intermediate processing chamber 627 which illustratively is a cool-down chamber. After the cool-down cycle, buffer robot 640 retrieves the wafer from the chamber 627 and returns it to the appropriate cassette load lock chamber 621.

The buffer robot 640 may be any suitable robot such as the dual four-bar link robot disclosed in allowed Maydan et. al. patent application, entitled "Multi-Chamber Integrated Process System", U.S. application Ser. No. 283,015, now abandoned, which application is incorporated by reference. The transfer robot 642 likewise may be any suitable robot such as the robot described in the aforementioned U.S. Pat. No. 5,186,718.

The control functions described above for the system 600 including the control of power to the RF coils, targets and substrates, robot control, chamber venting and pumping control, and cassette indexing are preferably provided by a workstation (not shown) programmed to control these system elements in accordance with the above description.

The process of the present invention for improving sidewall coverage may be combined with other techniques for increasing side wall coverage. For example, as set forth in copending application Ser. No. 08/753,251, now abandoned entitled "A Method and Apparatus for Improving Sidewall Coverage Sputtering in a Chamber Having an Inductively Coupled Plasma," filed Nov. 21, 1996 to Kenny Ngan et al., increased sidewall coverage by the underlayer material may be achieved even in a high density plasma chamber by generating the high density plasma only during an initial portion of the underlayer material deposition. It has been found that good bottom coverage may be achieved by ionizing the underlayer deposition material using a high density plasma during the initial portion of the deposition. Once good bottom coverage has been achieved, the RF power to the coil generating the high density plasma may be turned off entirely and the remainder of the underlayer deposition conducted without the high density plasma. It has been found that good sidewall coverage may then be achieved in the latter part of the deposition. Consequently, good overall coverage of the opening may be achieved combining the bottom coverage of the initial portion of the deposition with the sidewall coverage obtained during the latter portion of the underlayer deposition.

In each of the embodiments discussed above, a multiple turn coil 104 was used, but, of course, a single turn coil may be used instead. Still further, instead of the ribbon shape coil 104 illustrated, each turn of the coil 104 may be implemented with a flat, open-ended annular ring as described in copending application Ser. No. 08/680,335, now abandoned entitled "Coils for Generating a Plasma and for Sputtering," filed Jul. 10, 1996 and assigned to the assignee of the present application, which application is incorporated herein by reference in its entirety.

Each of the embodiments discussed above utilized a single coil in the plasma chamber. It should be recognized that the present invention is applicable to plasma chambers having more than one RF powered coil or RF powered shields. For example, the present invention may be applied to multiple coil chambers for launching helicon waves of the type described in aforementioned copending application Ser. No. 08/559,345, filed Nov. 15, 1995 and entitled "Method And Apparatus For Launching a Helicon Wave in a Plasma" now U.S. Pat. No. 6,264,812

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 4 MHz. An RF power setting of 1.5 kW is preferred but a range of 1.5–5 kW is satisfactory. In addition, a DC power setting for biasing the target 110 of 5 kW is preferred but a range of 2–10 kW and a pedestal 114 bias voltage of −30 volts DC is satisfactory.

A variety of sputtering gases may be utilized to generate the plasma including Ar, and a variety of reactive gases such as $NF_3$, $CF_4$, $H_2$, $O_2$ and many others may be used. Various sputtering gas pressures are suitable including pressures of 0.1–50 mTorr. For ionized PVD, a pressure between 10 and 100 mTorr often provides better ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A process for sputter depositing material into a workpiece structure having a sidewall, comprising:
   sputtering a target of a first metal which is at least 99.99% aluminum to form an underlayer comprising sputtered first metal on said workpiece; and
   depositing a second metal layer on said underlayer, wherein said second metal layer has a different composition than said first metal, said second metal layer including aluminum and having a lower aluminum content than said first metal.

2. The process of claim 1 wherein said underlayer is a wetting layer.

3. The process of claim 1 wherein said second metal layer is an interconnect layer.

4. The process of claim 1 wherein said second metal layer is formed of an aluminum alloy.

5. The process of claim 4 wherein said underlayer formation is performed in a first chamber and said second metal layer depositing is formed in a second chamber separate from said first chamber.

6. The process of claim 4 wherein said aluminum alloy includes copper.

7. The process of claim 1 wherein said second metal layer depositing includes filling openings in the substrate with said second metal and planarizing said second metal layer.

8. The process of claim 1 wherein said target material is at least 99.999% aluminum.

9. The process of claim 1, wherein said underlayer comprises a layer selected from the group consisting of a wetting layer, a seed layer, and a nucleation layer.

10. The process of claim 1, wherein said sputtering a target of a first metal is terminated prior to said depositing a second metal layer on said underlayer.

11. A process for sputter depositing material into a workpiece structure having a sidewall, comprising:
    sputtering a target of a first metal which is at least 99.99% aluminum to form an underlayer comprising sputtered first metal on said workpiece;
    depositing a second metal layer on said underlayer, wherein said second metal layer has a different composition than said first metal, said second metal layer having a lower aluminum content than said first metal; and
    providing a gas which includes hydrogen to react with said sputtered target material to form a deposition material which includes aluminum hydride as said underlayer is formed.

12. A process for sputter depositing material into a via or channel of a workpiece, comprising:
    providing a sputtering gas into a chamber;
    sputtering a target of at least 99.99% aluminum to sputter target material toward a workpiece;
    applying RF power to a coil to ionize a portion of said sputtered target material before it is deposited onto said workpiece;
    wherein a wetting layer of said:ionized, sputtered target material is formed on said workpiece;
    depositing in a second chamber a metal interconnect layer onto said wetting layer, said metal interconnect layer comprising a metal including aluminum, said metal having a lower aluminum content than said target material; and
    planarizing said interconnect layer.

13. The process of claim 12 further comprising providing a gas which includes hydrogen to react with said sputtered target material to form a deposition material which includes aluminum hydride as said wetting layer is formed.

14. The process of claim 12 wherein said target material is at least 99.999% aluminum.

15. A process for sputter depositing material into an opening of a workpiece, said opening having a bottom and sidewalls, said process comprising:
    sputtering a target of at least 99.99% aluminum material to sputter said target material toward a workpiece;
    ionizing a portion of said sputtered target material before it is deposited onto said workpiece so that sputtered material is deposited in said opening on said bottom and sidewalls of said opening to form a wetting layer; and
    depositing a second layer of deposition material on said wetting layer into said opening, said second layer of deposition material comprising aluminum having a purity less than that of said target.

16. The process of claim 15 further comprising providing a gas which includes hydrogen to react with said sputtered target material to form a deposition material which includes aluminum hydride as said wetting layer is formed.

17. The process of claim 16 wherein said hydrogen gas is provided at a pressure of 10–100 mTorr.

18. The process of claim 15 wherein said target material is at least 99.999% aluminum.

19. A semiconductor fabrication system for sputtering multiple layers of materials onto a workpiece, the system comprising:
    a first semiconductor fabrication chamber having plasma generation area within said chamber and a target of a first target material of at least 99.99% aluminum;
    a coil carried by said chamber and positioned to couple energy into said plasma generation area to ionize said first target material prior to deposition onto said workpiece to form a wetting underlayer on said workpiece;
    an RF generator coupled to said coil to provide RF power to said coil; and
    a second semiconductor fabrication chamber;
    said second chamber having a second target of a different composition than said first target material, to form a second layer of said second target material on said wetting underlayer, said second target material including aluminum, said second target material having a lower aluminum content than said first target material; and
    a transfer robot for transferring a workpiece having a wetting layer of said first target material from said first chamber to said second chamber for forming a second layer of said second target material onto said wetting underlayer.

20. The system of claim 19 wherein said first chamber contains a gas which includes hydrogen to react with said sputtered first target material to form a deposition material which includes aluminum hydride as said wetting underlayer is formed.

21. The system of claim 19 wherein said first target material is at least 99.999% aluminum.

22. The system of claim 19 wherein said second target material comprises aluminum and copper.

23. A process for sputter depositing material onto a workpiece structure having an opening at least partially defined by a sidewall, comprising:
    sputtering a target which is at least 99.99% aluminum to form sputtered material in an atmosphere including hydrogen and argon;
    ionizing a portion of said sputtered material;
    depositing a first layer comprising said ionized sputtered material in said opening;
    depositing a second layer on said first layer in said opening.

24. The process of claim 23, wherein said hydrogen gas is provided at a pressure of 10–100 mTorr.

25. The process of claim 23, wherein said argon gas is provided at a pressure of 2–10 mTorr.

26. The process of claim 23, wherein said first layer includes aluminum hydride.

27. The process of claim 23, wherein said entire sidewall is covered by said first layer.

28. The process of claim 23, wherein said second layer has a different composition than said first layer.

29. The process of claim 28, wherein said second layer comprises at least one material selected from the group consisting of aluminum and copper.

30. The process of claim 23, wherein said second layer comprises aluminum having a lower purity than that of said first layer.

31. A semiconductor fabrication system for sputtering multiple layers of materials onto a workpiece, the system comprising:

a first semiconductor fabrication chamber having a plasma generation area within said chamber;

said first chamber having a target of a first target material of at least 99.99% aluminum;

a coil carried by said first chamber and positioned to couple energy into said plasma generation area to ionize said first target materialism form an underlayer comprising said first target material on said workpiece;

a second semiconductor fabrication chamber; and said second chamber having a second target of a second target material which comprises aluminum, to form a layer on said underlayer, said second target material having a lower aluminum content than said first target material.

32. The system of claim 31, wherein said second target material further comprises copper.

* * * * *